United States Patent
Lin et al.

(10) Patent No.: US 7,254,194 B2
(45) Date of Patent: Aug. 7, 2007

(54) AUTOMATIC GAIN CONTROL FOR COMMUNICATION RECEIVERS

(75) Inventors: Leon Chia-Liang Lin, Union City, CA (US); Gerchih Chou, San Jose, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 807 days.

(21) Appl. No.: 10/057,502

(22) Filed: Jan. 25, 2002

(65) Prior Publication Data

US 2003/0142659 A1 Jul. 31, 2003

(51) Int. Cl.
*H04L 27/08* (2006.01)
*H04B 1/16* (2006.01)

(52) U.S. Cl. .................. 375/345; 375/317; 375/318; 455/127.2; 455/127.1; 455/194.2

(58) Field of Classification Search ............... 375/345; 359/145; 455/239.1; 370/251
See application file for complete search history.

(56) References Cited

U.S. PATENT DOCUMENTS

| | | | |
|---|---|---|---|
| 6,577,196 B2 * | 6/2003 | Hart | 330/279 |
| 6,870,891 B2 * | 3/2005 | Wu et al. | 375/345 |
| 2003/0194029 A1 * | 10/2003 | Heinonen et al. | 375/345 |

OTHER PUBLICATIONS

"Quadrature Amplitude Modulation", http://www.altera.com/products/ip/altera/t-alt-qam.html, pp. 1-2.*

* cited by examiner

*Primary Examiner*—Kevin Kim
*Assistant Examiner*—Linda Wong
(74) *Attorney, Agent, or Firm*—Eschweiler & Associates, LLC

(57) ABSTRACT

A communication receiver amplifies a pulse-amplitude-modulated (PAM) signal representing an integer-valued sequence of first data elements (D1) with an adjustable first gain (G1) and digitizes the amplified signal to produce a sequence of second data elements (D2) representing successive magnitudes of the PAM signal. A first automatic gain control (AGC) circuit determines the rate at which magnitudes of the second data sequence elements fall within a first range and adjusts G1 to maintain that rate within a second range. Digital signal processing circuits within the receiver process the second data to produce a sequence of third data elements (D3), each having a real number value substantially equal to a product of a second gain G2 and a corresponding one of the first data elements D1. A slicer rounds the real number represented by each third data sequence element to produce a corresponding integer-valued element of a fourth data sequence (D4). A second AGC circuit adjusts the second gain based on a combination of a sign of each fourth sequence element and a sign of a difference between corresponding third and fourth data sequence elements to keep each third data element as close as possible in value to its corresponding first data element.

18 Claims, 4 Drawing Sheets

AUTOMATIC GAIN CONTROL FOR COMMUNICATION RECEIVERS

BACKGROUND OF THE INVENTION

1. Field of the Invention

Figure 1:
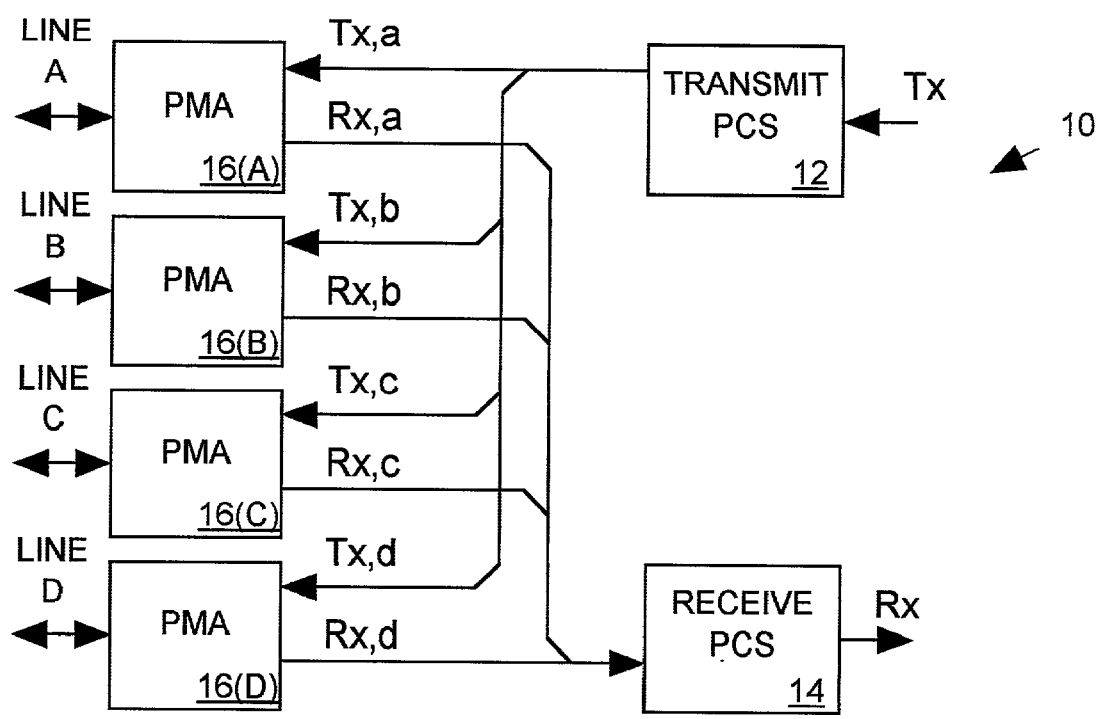

The present invention relates in general to communication receivers and in particular to a system for providing economical automatic gain control for a communication receiver.

2. Description of Related Art

The IEEE 802.3ab ("Ethernet") standard defines a digital media interface commonly used for transmitting data between computers linked through a network. The standard includes a "1000BASE-T" protocol enabling transceivers to communicate with one another through pulse amplitude modulation (PAM) signals conveyed on a set of four category 5 (CAT5) unshielded twisted-pair (UTP) conductors. A transceiver operating in accordance with the 1000BASE-T protocol can transmit and receive one 8-bit word every 8 nsec, thereby providing an effective communication rate of one gigabit per second in both directions.

Since each bit combination of a data word to be transmitted via a 1000BASE-T system may be treated as a symbol, for example representing a number or letter, an 8-bit word can be any of 256 different symbols. A 1000BASE-T transmitter maps the 256 symbols of each word into a separate combination of voltage levels of the set of four PAM signals, and it can change the PAM signal voltage level every 8 ns. The 1000BASE-T standard specifies a PAM-5 encoding scheme in which each of the four UTP conductors is allocated one of 5 symbols for each word to be transmitted, so that the four PAM signals can collectively represent $5^4$ (625) different symbols. The data sequences to be transmitted are encoded in a manner that maps the 256 8-bit data symbols into 512 of the 625 available PAM-5 symbols. The remaining 113 PAM-5 symbols are available for use as control codes.

As the 1000BASE-T signal passes from a transmitter to a receiver, it can be distorted in ways that can make it difficult for the receiver to extract the data conveyed by the waveform. When the signal has relatively few transitions during a relatively long period, it acts as a low frequency signal. Magnetic coupling modules that link the UTP cables to the transceivers act like high pass filters which attenuate low frequency signal components, thereby causing a type of distortion known as "baseline wander". "Insertion loss" is signal distortion due to attenuation caused by the impedance of the UTP cable conveying the 1000BASE-T signals between transceivers. A 1000BASE-T transceiver can transmit and receive signals at the same time over the same twisted pair, and the echo of a transceiver's outgoing signal distorts its incoming signal. A 1000BASE-T transceiver includes a separate channel for each of the four UTPs through which it communicates and an incoming signal arriving on any one UTP will include some "near end crosstalk" (NEXT) noise caused by the outgoing signals transmitted on the other UTPs. Since the four twisted pair are bundled into the same cable and are unshielded, an incoming 1000BASE-T signal arriving on any one of the four UTPs will included some "far end crosstalk" (FEXT) distortion caused by the 1000BASE-T signals arriving on the other three UTPs. Since the four UTPs may have slightly different number of twists per unit length, the actual lengths of the four UTPs within the same cable may differ, and therefore the four UTPs may provide differing signal path delays. Thus the four signals passing over the four UTPs can have a timing mismatch when they arrive at a receiver. 1000BASE-T receivers therefore include circuits for compensating incoming 1000BASE-T signal for these various types of distortion before that they can detect the data sequences represented by those signals.

Typical Prior Art Transceiver Circuit

FIG. 1 illustrates a prior art 1000BASE-T transceiver 10 in block diagram form. Transceiver 10 includes a transmit physical coding sublayer (PCS) 12 for scrambling and encoding an incoming sequence of 8-bit words Tx to produce four sequences of 3-bit data words Tx, a-Tx, d, each of which is an integer value of the set {−2, −1, 0, +1 or +2} and referencing one of the five PMA-5 symbols. Each data word Tx, a-Tx, d is supplied as input to a separate one of a set of four "physical medium attachment" (PMA) units 16(A)–16(D), and each PMA unit 16(A)–16(D) sets the voltage of a differential 1000BASE-T signal it transmits on a corresponding one of four UTPs A–D to one of the five voltage levels referenced by its input data Tx, a-Tx, d. Each PMA unit 16(A)–16(D) also detects the data sequence conveyed by an incoming 1000BASE-T signal transmitted by a remote transceiver on its corresponding UTP A-D and supplies that data sequence Rx, a-Rx, d to receive PCS 14. Receive PCS 14 de-scrambles and decodes the four Rx, a-Rx, d data sequences from PMAs 16(A)–16(D) to produce a single 8-bit output data word sequence Rx matching the remote transceiver's 8-bit input data sequence.

Figure 2:
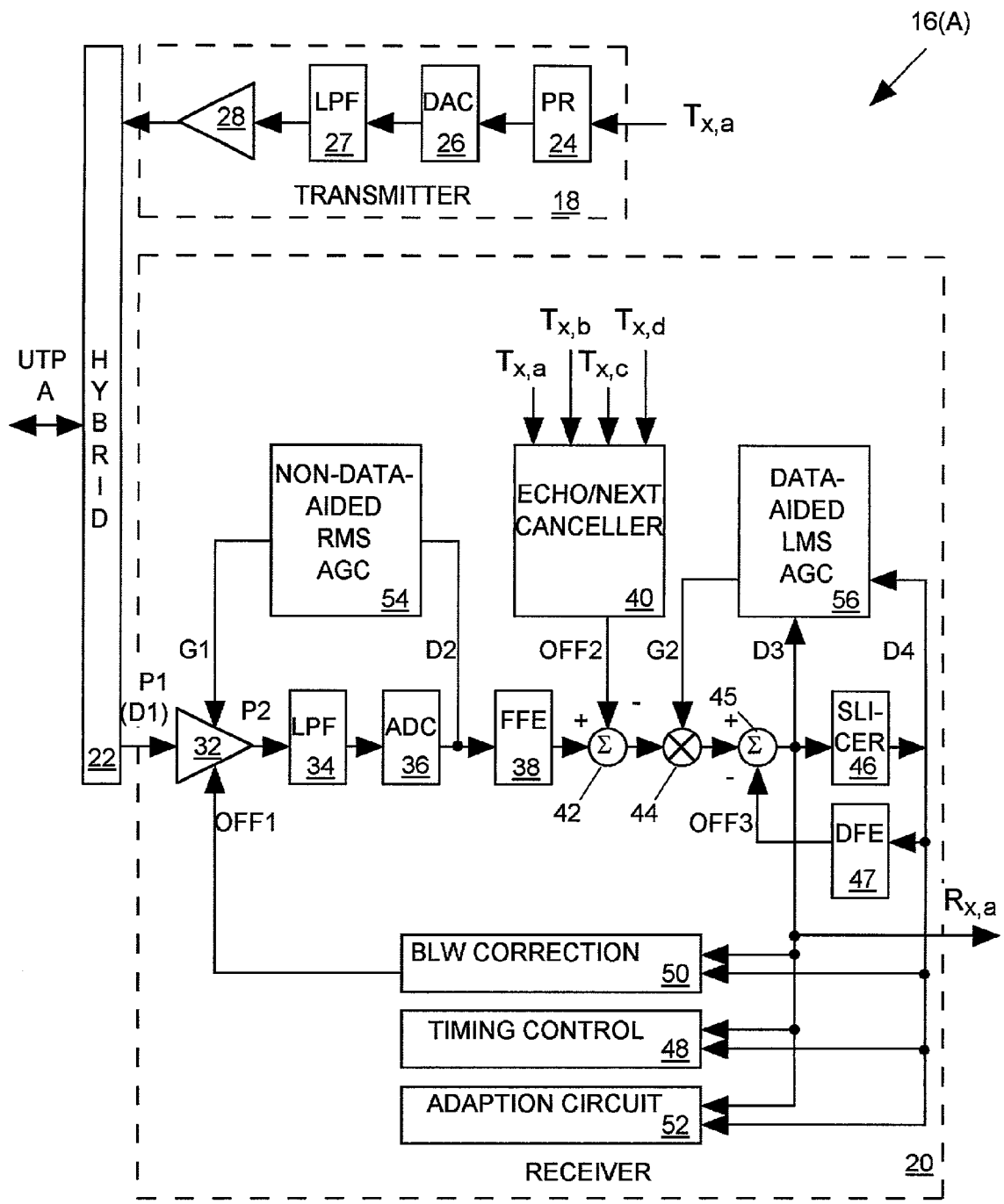

FIG. 2 illustrates PMA 16(A) of FIG. 1 in more detailed block diagram form; PMAs 16(B)–16(D) of FIG. 1 are similar. PMA 16(A) includes a transmitter 18 for sending a 1000BASE-T signal outward on UTP A in response to the incoming 3-bit Tx, a data sequence, a receiver 20 for generating the 3-bit output data sequence Rx, a in response to an incoming 1000BASE-T signal arriving on UTP A, and a "hybrid" circuit 22 for coupling the transmitter and receiver to UTP A.

Transmitter 18 includes a digital partial response (PR) filter 24 for converting the incoming Tx, a data sequence into a "partial response" data sequence indicating the voltage of each successive level of the outgoing 1000BASE-T signal. A digital-to-analog converter (DAC) 26 converts each word of the partial response sequence output of filter 24 into the indicated one of five 1000BASE-T analog voltage levels. A low pass filter (LPF) 27 filters any high frequency noise out of the DAC output signal, and a driver 28 responds to the output of LPF 27 by transmitting the 1000BASE-T signal outward on UTP A via hybrid 22.

Hybrid 22 passes the incoming 1000BASE-T signal P1 representing a sequence of first data elements D1 from a remote transceiver arriving on UTP A to receiver 20. Receiver 20 includes an amplifier 32 for amplifying the incoming 1000BASE-T signal with an adjustable gain (G1) and offset (OFF1). A low pass filter 34 removes high frequency noise from the amplifier output signal to produce an analog signal P2. An analog-to-digital converter (ADC) 36 digitizes the P2 signal to produce a sequence of second data elements D2 representing successive magnitudes of the P2 signal.

An automatic gain control (AGC) circuit 54 controls the gain G1 of amplifier 32 to compensate for insertion loss and to make sure that the peak-to-peak amplitude of the analog signal P2 supplied as input to ADC 36 remains close to the ADC's full input range. The transmit PCS 12 (FIG. 1) of a 1000BASE-T transmitter scrambles and encodes the Tx, a-Tx, d sequences in such a way as to ensure that over time the 1000BASE-T signals conveyed on UTPs A–D will have a constant, predictable root mean square (RMS) value. AGC circuit 54 monitors the D2 sequence output of ADC 36 and adjusts amplifier gain G1 to ensure that the average RMS value of the input signal to ADC 36 remains close to a target RMS value, thereby ensuring that ADC 36 will operate over its full scale range. A baseline wander (BLW) correction circuit 50 controls the value of the OFF1 data controlling the offset of amplifier 32.

A feedforward equalizer (FFE) 38 decodes the sequence of second data elements D2 and compensates it for distortions introduced by the UTP. The amount of echo distortion of the incoming 1000BASE-T signal is proportional to the magnitude of the outgoing 1000BASE-T signal transmitter 18 is currently sending outward on UTP A. The amount of near end crosstalk (NEXT) distortion in the incoming 1000BASE-T signal is proportional to the magnitude of the outgoing 1000BASE-T signals being transmitted outward by transmitters within the other three PMAs 16(B)–16(D) of FIG. 1. An echo/NEXT canceller circuit 40 monitors the Tx, a-Tx, d signals produced by all four transmitters and supplies an offset data sequence OFF2 to a summer 42 representing the magnitude of echo and NEXT distortion that has been added to the incoming signal. Summer 42 subtracts the OFF2 sequence generated by echo/NEXT canceller 40 from the output data sequence produced by FFE 38 to produce a 5-level partial response data sequence that is compensated for echo and NEXT distortion.

A multiplier 44 and a summer 45 amplify and offset the output sequence of summer 42 by a gain G2 and an offset OFF3 to produce a sequence of 8-bit third data elements D3. Each third data sequence element D3 corresponds to a separate one of the first data sequence elements D1 represented by the incoming 1000BASE-T signal and has a real number value that is proportional to a product of the integer value of its corresponding data sequence element D1 and gain G2 when OFF3 is appropriately adjusted. Since each first data sequence element D1 has an integer value of the set $\{-2, -1, 0, +1, +2\}$, then when gain G2 and OFF3 are properly adjusted, each 8-bit third data sequence element D3 will be relatively close in magnitude to one of the integer values of the set $\{-2, -1, 0, +1, +2\}$. However if either gain G2 or OFF2 are too high or too low, then each third data D3 will have a real number value that is somewhat larger or smaller than the integer value of its corresponding first sequence element D1.

12A slicer 46 rounds off each 8-bit "soft decision" data sequence element D3 to produce a corresponding 3-bit "hard decision" data sequence element D4 representing the nearest integer value of the set $\{-2, -1, 0, +1, +2\}$. A decision feedback estimator (DFE) 47 processes the fourth data element sequence D4 to control the offset data OFF3 supplied to summer 45. DFE 47 is able to determine whether OFF2 is correctly adjusted by detecting whether values of elements of the slicer's "soft decision" D3 sequence input are consistently higher or lower than the integer values $\{-2, -1, 0, +1, +2\}$ of corresponding fourth data sequence elements D4 of the slicer's "hard decision" output sequence. When gain G2 is adequately adjusted, squares of the values of corresponding third and fourth data sequence elements D3 and D4 will be very close in value. The average (mean) difference between the squares of corresponding third and fourth data sequence elements D3 and D4 indicates a direction in which gain G2 should be adjusted. AGC 56 therefore continuously computes the mean of the difference between squares of corresponding D3 and D4 data sequence elements and adjusts gain G2 accordingly to keep that mean as small as possible.

A timing control circuit 48 monitors the sequences of third and fourth data elements D3 and D4 to determine the phase of the incoming 1000BASE-T signal's 125 MHz data cycle and produces timing signals for clocking the various receiver 20 components that processes the incoming signal. BLW correction circuit 50 monitors the sequence of fourth data elements D4 to determine how to adjust the OFF1 data input to amplifier 32 to compensate for baseline wander. An adaptation circuit 52 processes the sequences of third and fourth data elements D3 and D4 to determine how to set filter coefficients within FFE 38, echo/NEXT canceller 40 and BLW correction circuit 50.

AGC 54 is called a "non-data-aided RMS AGC" because it is not concerned with the data content D1 conveyed by the incoming 1000BASE-T signal when adjusting the gain G1 of amplifier 32; it is only concerned with the RMS value of the D2 data sequence output of ADC. AGC 56 is called a "data-aided LMS" AGC because its decision as to whether to increase or decrease the gain G2 of multiplier 44 is based a least means square algorithm processing data values represented by corresponding third and fourth data sequence elements D3 and D4 which are alternative 8-bit and 3-bit representations of the first data sequence elements D1 conveyed by the incoming 1000BASE-T signal.

While the prior art receiver 20 architecture illustrated in FIG. 2 is well-adapted for extracting the data content of incoming 1000BASE-T signal P1, the conventional AGCs 54 and 56 are expensive. AGC 54 uses a digital multiplier when calculating the RMS amplitude of digital data sequence D2 to determine how to adjust gain G1, and AGC 56 uses two digital multipliers to calculate the squares of the third and fourth data sequence elements D3 and D4 when determining how to adjust gain G2. Since digital multipliers are expensive, what is needed is a receiver including inexpensive non-data-aided and data-aided AGC circuits that can accurately control gains G1 and G2 without having to use expensive multipliers.

BRIEF SUMMARY OF THE INVENTION

The invention relates to a communication receiver of the type which amplifies with an adjustable first gain (G1) a differential pulse amplitude modulated (PAM) signal representing a sequence of integer-valued first data elements (D1). A digitizer then digitizes the amplified PAM signal to produce a sequence of second data sequence elements (D2) representing successive magnitudes of the PAM signal. A first automatic gain control (AGC) circuit monitors the second data sequence elements and controls gain G1 to keep the peak-to-peak amplitude of the amplified PAM signal near the full scale range of the digitizer so that the digitizer digitizes the amplified PAM signal with high resolution. Digital signal processing circuits process the second data sequence to produce a sequence of third data elements (D3), each of which represents a real number that is proportional to a product of a corresponding one of the first data sequence elements and a second gain (G2). A slicer rounds the real number represented by each third data sequence element to the nearest integer value to produce a corresponding fourth data sequence element (D4). A second AGC circuit adjusts second gain (G2) of the DSP circuit so that the value of each third data sequence element is as close as possible in value to its corresponding integer-valued fourth data sequence elements.

In accordance with one aspect of the invention, the first automatic gain control (AGC) circuit processes the second data sequence elements to determine a rate of occurrence of second data sequence elements having magnitudes falling within a predetermined magnitude range and adjusts amplifier gain G1 to maintain that rate within a predetermined frequency range.

In accordance with another aspect of the invention, the second AGC adjusts the second gain in accordance with an assessment of the probability that the second gain is too high or too low, the assessment being based on a combination of the signs of the fourth data sequence elements and signs of the magnitude difference between corresponding third and fourth data sequence elements. A positive fourth data sequence element smaller than its corresponding third sequence element, or a negative fourth data sequence element larger than its corresponding third sequence element increases the probability that gain G2 is too high. Conversely, a negative fourth data sequence element larger than its corresponding third sequence element, or positive fourth data sequence elements smaller than its corresponding third sequence element increases the probability that gain G2 is too high.

Unlike prior art AGC circuits employed in communication receivers, neither the first nor the second AGC circuit employs complex, expensive digital multipliers.

It is accordingly an object of the invention to provide methods and means for processing a PAM signal to determine the data sequence it represents without requiring the use of AGC circuits employing expensive digital multipliers.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

Figure 3:
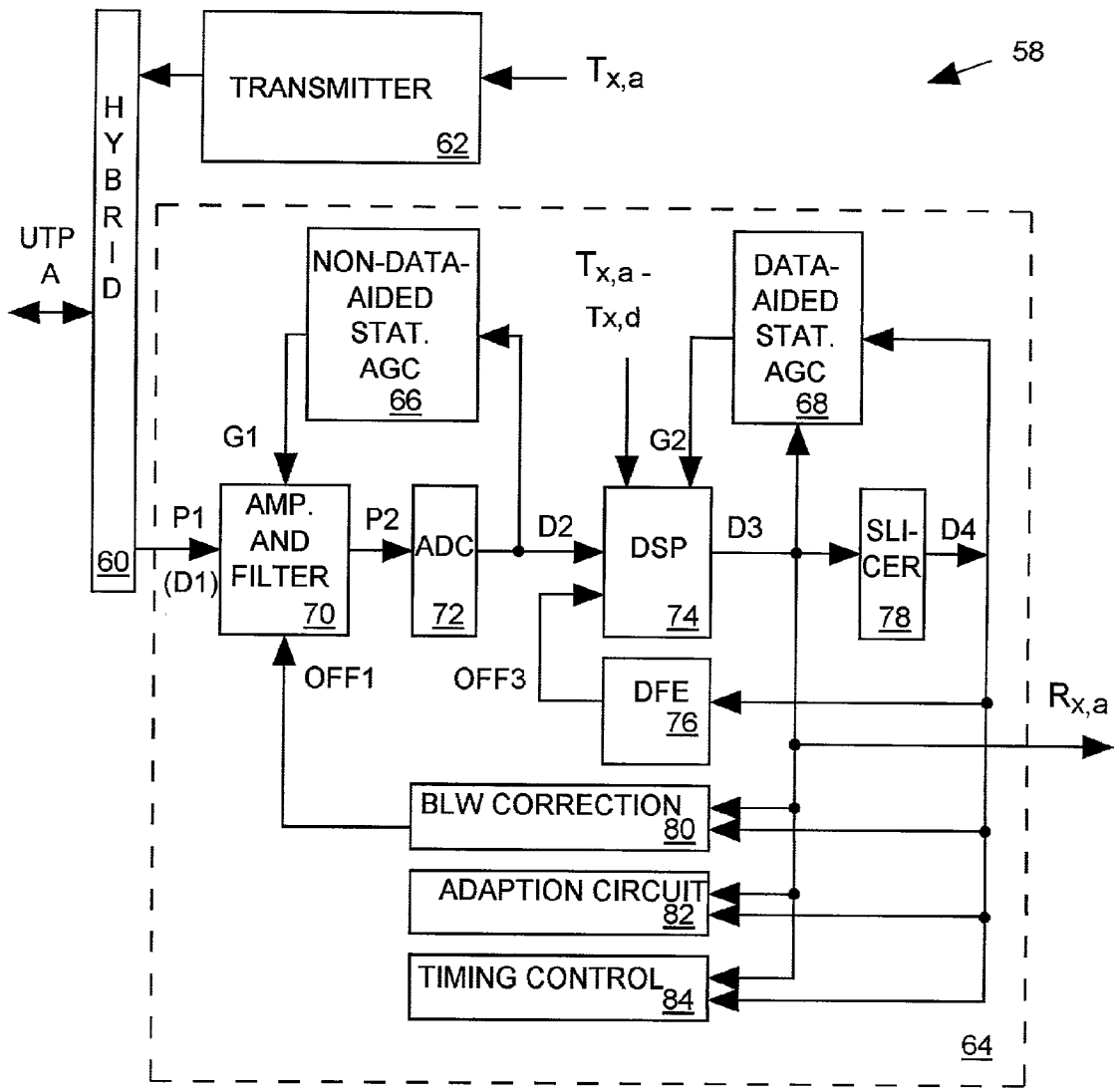
Figure 4:
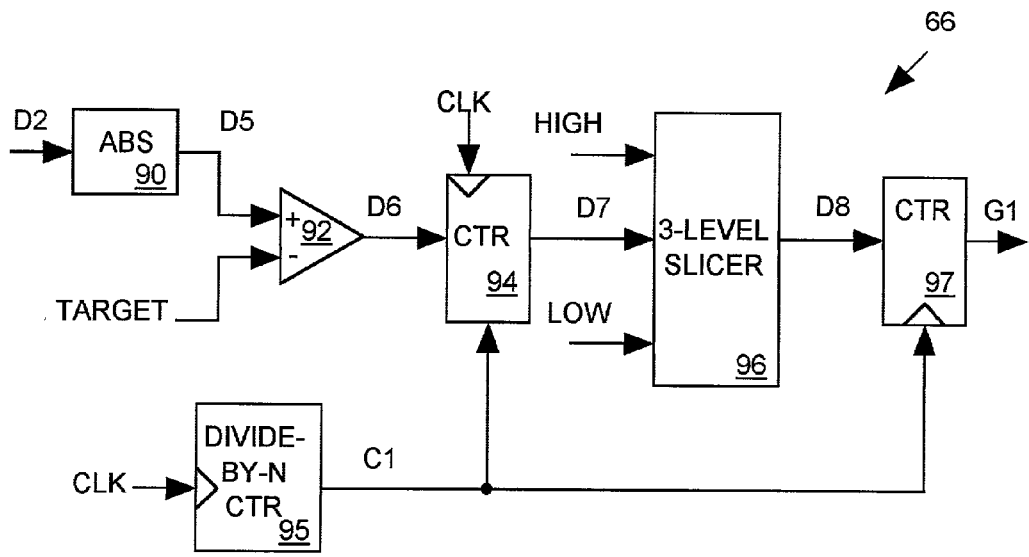
Figure 5:
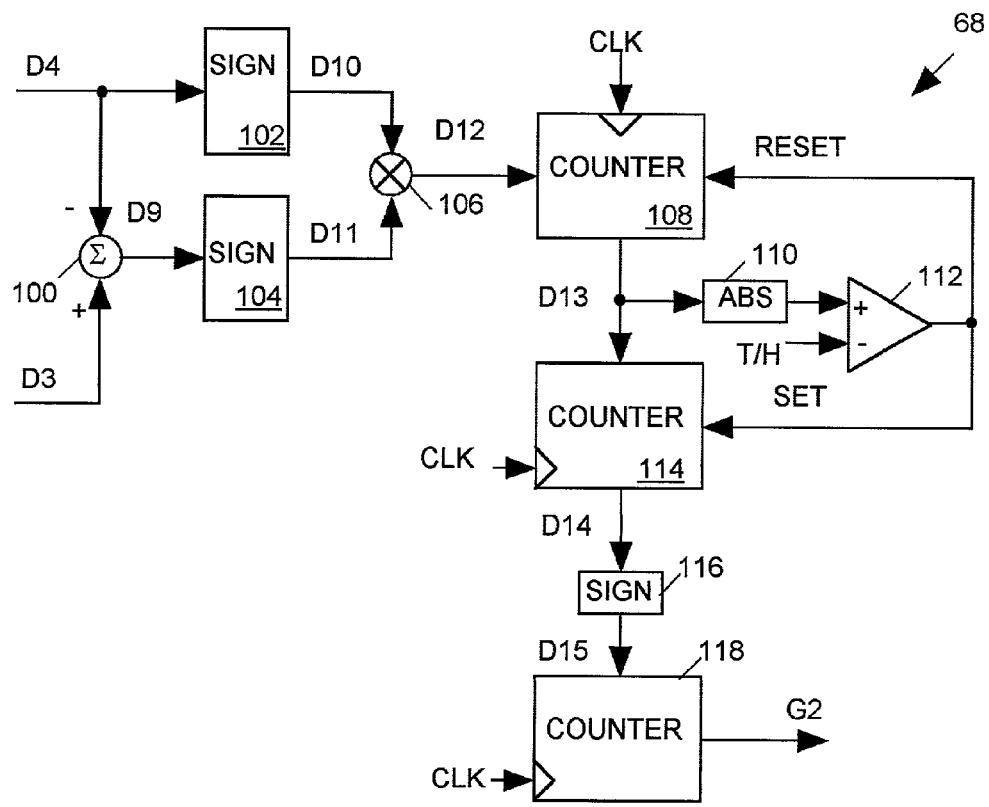

FIG. 1 illustrates a prior art 1000BASE-T transceiver in block diagram form,

FIG. 2 illustrates one of the physical media attachment (PMA) units of FIG. 1 in more detailed block diagram form, FIG. 3 illustrates an improved PMA unit in accordance with the invention in block diagram form, FIG. 4 illustrates the non-data-aided automatic gain control (AGC) circuit of FIG. 3 in more detailed block diagram form, and FIG. 5 illustrates the data-aided AGC circuit of FIG. 4 in more detailed block diagram form.

DETAILED DESCRIPTION OF THE INVENTION

This specification describes a 1000BASE-T communication transceiver as an exemplary embodiment or application of the invention the applicant considers to be the best mode of practicing the invention. However those of ordinary skill in the art will appreciate that the invention is useful in other applications.

FIG. 3 illustrates an 1000BASE-T transceiver 58 including a hybrid circuit 60 and a transmitter 62 similar to hybrid circuit 22 and transmitter 18 of FIG. 2, and a receiver 64 generally similar to receiver 20 of FIG. 2 except that it employs improved non-data-aided (NDA) and data-aided (DA) automatic gain control (AGC) circuits 66 and 68 in accordance with the invention for controlling gains G1 and G2.

Hybrid circuit 60 delivers to receiver 64 an incoming differential signal P1 having a time varying magnitude representing a sequence of first data elements D1. Receiver 64 includes an amplifier and filter section 70 for amplifying the P1 signal with gain G1 and offset OFF1 and for filtering the result to produce an output 1000BASE-T signal P2. An analog-to-digital converter (ADC) 72 periodically digitizes the P2 signal to produce a second data sequence D2 representing magnitudes of the P2 signal at a succession of times. AGC 66 processes the D2 signal in a manner described below to adjust the gain G1 of amplifier/filter 70 to set the peak-to-peak voltage of the P2 signal near the full-scale input range of ADC 72 so that the ADC can digitize the P2 signal with high resolution. A baseline wander (BLW) correction circuit 80 adjusts offset OFF1 to compensate the P2 signal for baseline wander.

A digital signal processing (DSP) circuit 74 processes data sequence D2 to produce a sequence of third data elements D3, each of which may be, for example, 8 bits wide. Each third data sequence element D3 represents a real number having an integer and fractional component that is proportional to a product of the integer value of a corresponding one of the first data sequence elements D1 and gain data G1 supplied as input to DSP circuit 74. DSP circuit 74 suitably includes a feed forward equalizer (FFE) similar to FFE 38 of FIG. 2 for equalizing the output of ADC 72, an echo/NEXT canceller circuit and a summer similar to canceller circuit 40 and summer 42 of FIG. 2 for canceling crosstalk and echo represented by incoming Tx, a-Tx, d data, and a multiplier and summer similar to multiplier 44 and summer 45 of FIG. 2 for controlling a gain and offset of DSP 74 in response to input gain data G2 and offset data OFF3.

Receiver 64 also includes a decision feedback estimator 76 similar to DFE 47 of FIG. 2 for producing the OFF3 signal. A slicer 78 rounds the magnitude of each third data sequence element D3 to the nearest integer value to produce a corresponding fourth data sequence element D4. The data-aided AGC 68 processes data sequences D3 and D4 in a manner described in detail below to control the gain G2 of DSP 74. BLW correction circuit 80 monitors the data sequences D3 and D4 to determine how to adjust the offset input OFF1 to amplifier 70. An adaption circuit 82 processes the third and fourth data sequence elements D3 and D4 to determine how to adjust coefficients of filters included within DSP 74. A timing control circuit 84 processes the data sequences D3 and D4 to provide clock signals for controlling logic timing within devices 72–82.

Non-Data-Aided AGC

FIG. 4 illustrates the "non-data-aided" AGC 66 of FIG. 3 in more detailed block diagram form. Since the analog signal input to ADC 72 of FIG. 3 is a differential signal, the sequence of second data sequence elements D2 generated by ADC 72 ranges between negative and positive peak values which are a function of the gain G1 of amplifier 70. AGC 66 controls the gain G1 of amplifier 70 so that peak-to-peak amplitude of the input signal to ADC 72 stays near the full-scale range of the ADC, thereby ensuring that ADC 72 digitizes the P2 signal with its full resolution.

The sequence of first data sequence elements D1 represented by 1000BASE-T signal P2 is scrambled and encoded in a manner that ensures that the P2 signal will visit each of its voltage levels with a predictable average frequency. Since second data sequence elements D2 are generated at a constant frequency, the number of second data sequence elements D2 per unit time having values within any particular range should remain relatively constant and should be predictable if OFF1 and G1 are appropriately adjusted. When G1 is too high, values of second data sequence elements D2 will fall outside that range too frequently. When G2 is too low, values of second data sequence elements D3 will fall within that range too frequently.

Accordingly AGC 66 includes an absolute value circuit 90 producing fifth data D5 in response to each second data sequence element D2, the fifth data representing the absolute value of a corresponding element of the D2 sequence. A comparator 92 compares each fifth data sequence element D5 to a target value (TARGET) and sets its single bit output bit data sequence element D6 to a logical 1 or 0 depending on whether is input data sequence element D5 is greater than or less than TARGET. The TARGET value may be adjusted to equal any expected P2 signal level between 0 and its maximum expected positive level. Over time data D6 will visit its 1 state with a predictable average frequency when G1 is appropriately set, although it may vary from its expected average frequency for short periods.

The D6 output of comparator 92 drives an enable input of a counter 94 which counts pulses of a CLK signal when enabled by the D6 signals. The CLK signal is produced by timing control circuit 84 of FIG. 3 which is synchronized to the D2 data cycle.

Whenever D5 exceeds TARGET, D6 is a logical 1 and counter 94 counts up on the next CLK signal pulse. Whenever D5 is less than TARGET RMS, D6 is a logical 0 and counter 94 refrains from counting the next CLK pulse. A divide-by-N counter 95 produces an output control signal pulse C1 on every Nth pulse of the CLK signal, and each signal C1 pulse resets the count output D7 of counter 94. Thus the state of signal D7 immediately prior to each pulse of signal C1 indicates the number of times the absolute value of data D2 exceeded the TARGET value during the preceding N data cycles of the P2 signal, where N is an integer greater than 1, for example 8 or 16.

After N cycles, D7 should have a reached value within a predictable range if gain G1 is properly adjusted. Accordingly, a three-level slicer 96 compares the output count D7 of counter 94 to constant high threshold value (HIGH) and a constant low threshold value (LOW) where the HIGH and LOW level values bound the expected range of the D7 value. Slicer 96 produces output data D8 indicating the results of the comparison. D8 has value +1 when D7 is less than LOW, 0 when D7 is between LOW and HIGH, and −1 when D7 is greater than HIGH. The D8 data drives the direction control input of a counter 97 which counts pulses of the C1 signal to produce the gain data G1 controlling the gain of amplifier 70. When D8 has value +1, counter 97 increments the G1 value on the next pulse of the C1 signal, and when D7 has value −1, counter 97 decrements the G1 value on the next pulse of the C1 signal. Otherwise when D8 has value 0, counter 97 does not change the G1 value on the next pulse of the C1 signal.

Thus AGC 66 determines whether to increase or decrease gain G1 by determining whether the number of elements of each successive set of N second elements D2 that exceed the TARGET value periods falls outside the range indicated by the HIGH and LOW values. The values of N, HIGH and LOW are suitably chosen so that signal D8 is most likely to have value 0 when G1 is properly adjusted and is most likely to be a −1 or a +1 when G1 is too low or too high. AGC 66 therefore counts the number of second sequence elements D2 falling within a target magnitude range per unit time (N CLK cycles) and adjusts G1 to keep that number within the appropriate HIGH/LOW range. Unlike AGCs employed in prior art 1000BASE-T receivers, AGC 66 does not calculate an RMS value of the D2 data sequence and does not require the use of an expensive digital multiplier to find the square of the value of each element of the D2 signal. As shown in FIG. 5, AGC 66 carries out is gain control function using only inexpensive logic devices such as counters and comparators.

Data-aided AGC

Referring again to FIG. 3, AGC 68 looks at the relationship between corresponding third and fourth data sequence elements D3 and D4 to determine how to adjust the gain G2 of DSP circuit 74. Each third data sequence element D3 produced by DSP circuit 74 is an 8-bit real number having integer and fractional portions that is proportional to the product of G2 and the integer value of a corresponding one of the first data sequence elements D1. AGC 68 and DFE 76 adjust gain G2 and offset OFF3 of DSP circuit 74 so that the magnitude of each element of the D3 sequence (often called the "soft decision") is as close as possible to the integer value of its corresponding D1 sequence element, which may be any of the set {−2, −1, 0, +1, +2}. Slicer 78 rounds off the real number value of each third data sequence element D3 to produce a corresponding integer-valued fourth data sequence element D4 (often called the "hard decision"). When G1 and OFF3 are properly adjusted, values of the sequence of fourth data sequence elements D4 will substantially match values of the sequence of first data sequence elements D1 conveyed by the incoming P1 signal.

Thus when gain G2 and OFF3 are properly adjusted, each element of the 8-bit D3 sequence will have a value close to a member the integer set {−2, −1, 0, +1, +2} and will have nearly the same value as a corresponding integer-valued fourth data sequence element D4 generated by slicer 78. When gain G2 and/or OFF3 are improperly adjusted, third data sequence elements D3 will be substantially higher or lower than their corresponding fourth data sequence elements D4. Since improperly adjusted gain G2 and offset OFF3 produce differing patterns in the magnitude differences between corresponding D3 and D4 data sequences, AGC 68 and DFE 76 are able to determine whether to change gain G2 or offset OFF3 by monitoring those patterns.

When gain G2 is properly set but offset OFF3 is set too high or too low, all third data sequence elements will be either lower or higher in value than their corresponding fourth data sequence elements D4. When offset OFF3 is properly set, but gain G2 is too low, then the positive third data sequence elements D3 will be lower in magnitude than corresponding fourth data sequence elements D4 and the negative third data sequence elements will be higher in value than their corresponding fourth data sequence elements D4. Conversely when gain G2 is too high, positive third data sequence elements will be greater in value than corresponding fourth data sequence elements D4 and the negative third data sequence elements D3 will be lower in value than corresponding fourth data sequence elements D4.

AGC 68 therefore monitors the third and fourth data sequence elements D3 and D4 to determine whether G2 is to high or too low based on the following criteria:

1. A fourth data sequence element D4 having a positive value less than the value of its corresponding third data sequence element D3 increases the probability that gain G2 is too high.

2. A fourth data sequence element D4 having a positive value greater than the value of a corresponding third data sequence element D3 increases the probability that gain G2 is too low.
3. A fourth data sequence element D4 having a negative value greater than the value of a corresponding third data sequence element D3 increases the probability that gain G2 is too high.
4. A fourth data sequence element D4 having a negative value less than the value of a corresponding third data sequence element D3 increases the probability that gain G2 is too low.
5. A fourth data sequence element D4 having a 0 value or having the same value as its corresponding third data sequence element D3 does not alter the probability that gain G2 is either too or too high.

When gain G2 is properly set, but OFF3 is too large or too small, then the above criteria, when applied to successive observations of the differences in values between corresponding third and fourth data sequence elements D3 and D4, give conflicting indications regarding the probability that gain G2 is too high or too low. Since fourth data sequence elements D4 are positive and negative with equal average frequency, the above criteria will tell AGC 68 that gain G2 is likely to be too low just as often as they tell AGC 68 that gain G2 is likely to be too high. For example when OFF3 is too large, positive and negative valued fourth data sequence elements D4 will be less than corresponding third data sequence elements D3. Since AGC 68 will see positive forth data sequence elements D4 as frequently as it sees negative fourth data sequence elements D4, criteria 2 will tell AGC 68 gain G2 is too low just as often as criteria 4 will tell AGC 68 gain G2 is too high. AGC 68 responds to such conflicting indications occurring with equal frequency over time by keeping gain G2 unchanged.

However when gain G2 is too high, then successive observations of the magnitude differences between corresponding third and fourth data sequence elements D3 and D4 indicate that gain G2 is too high more often than they indicate gain G2 is too low, based on the above criteria. Conversely, when gain G2 is too low, successive observations of the corresponding third and fourth data sequence elements D3 and D4 will tell AGC 68 gain G2 is to high more often than they tell it gain G2 is to low. Accordingly when over a period of time observations of magnitude differences between corresponding third and fourth data sequence elements D3 and D4 more frequently tell AGC 68 gain G2 is too high or too low, AGC 68 changes gain G2 in the appropriate direction.

FIG. 5 illustrates AGC 68 of FIG. 3 in more detailed block diagram form. A summer 100 produces an output sequence of data sequence elements D9, each representing the value of the magnitude difference between a corresponding pair of third and fourth data sequence elements. One sign detection circuit 102 produces output data D10 indicating the sign of the fourth data sequence element D4. Data D10 has value −1 if D4 is negative, 0 is D3 is 0 and +1 if D4 is positive. Another sign detection circuit 104 produces output data D11 having value of the set {−1, 0, +1} representing the sign of difference data D9. A multiplier circuit 106 (suitably implemented by a simple encoder) multiplies the D10 and D11 data sequences to produce a data sequence D12, elements of which also have values of the set {−1, 0, +1}. The portion of AGC 68 including summer 100, sign circuits 102 and 104 and multiplier 106 carry out a decision process implementing criteria 1–5 listed above. A D12 value of −1 indicates that gain G2 is likely to be too high, a D12 value of +1 indicates that gain G2 is likely to be too low, and a D12 value of 0 provides no indication that gain G2 is likely to be too low or too high.

AGC 68 includes a counter 108 for counting pulses of a clock signal (CLK) produced by timing control circuit 84 of FIG. 3 The CLK signal is synchronized to the D12 data cycle. When D12 is +1 counter 80 increments its output count D13 in response to each CLK signal pulse, and when D12 is −1 counter 108 decrements D13 in response to each CLK signal pulse. Counter 80 keeps its count D13 unchanged when D12 has a value of 0. Thus count D13, which may be either positive or negative, indicates the difference between the number of times the D12 signal indicated that gain G2 is likely to be too low and the number of times it indicated gain G2 is likely to be too high since count D13 was last reset to zero. Count D13 therefore becomes increasingly negative or positive over time depending on whether gain G2 is too low or too high and tends to remains relatively constant when gain G2 is properly adjusted.

An absolute value circuit 110 converts D13 into its absolute value and applies the result as input to a comparator 112. Comparator 112 supplies a RESET signal pulse to reset counter 108 to drive its output count D13 to zero whenever the absolute value of D13 reaches a threshold level T/H. At the same time comparator 112 also signals a counter 114 to set its output count D14 to the value of D13. After having set its output count D14 to the positive or negative value of D13, counter 114 counts pulses of the CLK signal, progressively increasing or decreasing D14 until it reaches 0. A sign detector circuit 116 produces output data D15 having a value of the set {−1, 0 or +1} depending on the sign of D14. When D14 is positive, D15 has value +1 and tells a counter 118 to increment gain G2 on each pulse of the CLK signal. When D14 is negative, D15 has value −1 and tells counter 118 to decrement gain G2 on each pulse of the CLK signal. When D14 has a value of 0, D15 also has value 0 and tells counter 118 to keep gain G2 constant.

As described above, counter 108, absolute value circuit 110 and comparator 112 together determine when, based on the information provided by D12, it is statistically likely that gain G2 is too high or too low and provides an indication D13 of the amount by which gain G2 should be increased or decreased. Counter 114, sign circuit 116 and counter 118 then cooperate to increment or decrement gain G2 by that amount. AGC 68 therefore determines whether to increase or decrease gain G2 based on a statistical analysis of the pattern of signs and magnitude differences between corresponding third and fourth data sequence elements D3 and D4. Since it does not have to compute the difference between the squares of corresponding third and fourth data sequence elements D3 and D4, as does prior art least mean square AGC circuit 56 of FIG. 2, AGC 68 does not require the expensive multipliers needed to carry out the squaring operation. While it does employ a single multiplier 106, that multiplier multiplies two numbers D10 and D11 having values that are restricted to the set {−1, 0, +1}. Such a simple multiplier can be implemented, for example, by inexpensive encoding logic.

Thus has been shown and described a communication receiver having both non-data-aided and data-aided automatic gain control circuits which do not require complex and expensive digital multipliers to carry out their gain control functions. The forgoing specification and the drawings depict the best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the best mode depicted in the specification and drawings. Accordingly should any appended claim describe an element or step only in terms of its function, then it is intended that the claim's description of the element or step be interpreted as reading on any element or step having the described function, regardless of any structural limitation associated with the best mode example of the invention depicted in this specification or in the drawings.

What is claimed is:

1. An apparatus for processing a differential first pulse amplitude modulated (PAM) signal having a time varying magnitude representing a sequence of integer-valued first data elements, the apparatus comprising:
   amplifying means for amplifying the first PAM signal with an adjustable first gain to produce a second PAM signal;
   digitizing means for processing the second PAM signal to generate a sequence of second data elements having values representing magnitudes of the second PAM signal at a succession of times; and
   first automatic gain control (AGC) means for determining a number of second data elements generated per unit of time having values within a first range and for adjusting the first gain when the determined number falls outside a second range wherein the first AGC means comprises:
      first means for generating a counter data of value representing a count of second data elements within a succession of N data elements having values falling within the first range, where N is an integer greater than 1, and
      second means for adjusting the first gain when the value of the counter data falls outside the second range;
      wherein the first means comprises:
         means for generating an output data in response to each second data element, the output data being of value indicating whether an absolute value of the second data element resides within the first range;
         a first counter receiving the output data, for altering the value of the counter data in response to each pulse of a periodic clock signal (CLK) depending on whether the output data is of value indicating that the absolute value of the second data element resides within the first range, and for setting the value of the counter data to zero upon receipt of each pulse of a first control signal; and
         means for supplying a pulse of the first control signal to the first counter in response to every Nth pulse of the clock signal.

2. The apparatus in accordance with claim 1, further comprising:
   digital signal processing (DSP) means for processing the second data elements to produce a sequence of third data elements, each having a real number value that is substantially proportional to a product of the integer value of a corresponding one of the first data elements and a second gain;
   slicer means for processing the third data elements to produce a sequence of fourth data elements, wherein each fourth data element has an integer value approximating a value of a corresponding one of the third data elements; and
   second AGC means for controlling the second gain in response to a comparison of values of corresponding third and fourth data elements.

3. The apparatus in accordance with claim 2, wherein the second AGC means comprises:
   means for generating first sign indicating data in response to each fourth data element, wherein a value of the first sign indicating data indicates whether a value of the fourth data element is zero, higher than zero, or lower than zero;
   means for generating second sign indicating data in response to each third data element and its corresponding fourth data element, wherein a value of the second sign indicating data indicates whether a difference in values between the third data elements and its corresponding fourth data element is zero, higher than zero, or lower than zero;
   counter means for adjusting a value of count data in response with a combination of values of the first sign indicating data and the second sign indicating data; and
   second gain control means for adjusting the second gain in response to the count data.

4. The apparatus in accordance with claim 3 wherein the second gain control means alters the second gain when the value of the count data goes outside predetermined limits.

5. The apparatus in accordance with claim 4 wherein the second gain control means also signals the counter means to set the value of the count data to zero when the value of the count data goes outside the predetermined limits.

6. An apparatus for processing a differential first pulse amplitude modulated (PAM) signal having a time varying magnitude representing a sequence of integer-valued first data elements, the apparatus comprising:
   amplifying means for amplifying the first PAM signal with an adjustable first gain to produce a second PAM signal;
   digitizing means for processing the second PAM signal to generate a sequence of second data elements having values representing magnitudes of the second PAM signal at a succession of times;
   first means for generating counter data of value representing a number of second data elements within a succession of N data elements having values falling within a first range, where N is an integer greater than 1, and
   second means for adjusting the first gain when the value of the counter data falls outside a second range;
   digital signal processing (DSP) means for processing the second data elements to produce a sequence of third data elements, each having a real number value that is substantially proportional to a product of the integer value of a corresponding one of the first data elements and a second gain;
   slicer means for processing the third data elements to produce a sequence of fourth data elements, wherein each fourth data element has an integer value approximating a value of a corresponding one of the third data elements;
   AGC means for controlling the second gain in response to a comparison of values of corresponding third and fourth data elements;
   wherein the AGC means comprises:
   means for generating first sign indicating data in response to each fourth data element, wherein a value of the first sign indicating data indicates whether a value of the fourth data element is zero, higher than zero, or lower than zero;

means for generating second sign indicating data in response to each third data element and its corresponding fourth data element, wherein a value of the second sign indicating data indicates whether a difference in values between the third data element and its corresponding fourth data element is zero, higher than zero, or lower than zero;

means for adjusting a value of count data in response to a combination of values of the first sign indicating data and the second sign indicating data; and gain control component means for adjusting the second gain in response to the count data.

7. The apparatus in accordance with claim 6 wherein the gain control component means alters the second gain when the value of the count data goes outside predetermined limits.

8. The apparatus in accordance with claim 7 wherein the gain control component means also signals the counter means to set the value of the count data to zero when the value of the count data goes outside the predetermined limits.

9. A method for processing a differential first pulse amplitude modulated (PAM) signal having a time varying magnitude representing a sequence of integer-valued first data elements, the method comprising the steps of:

a. amplifying the first PAM signal with an adjustable first gain to produce a second PAM signal;
 b. digitizing the second PAM signal to generate a sequence of second data elements having values representing magnitudes of the second PAM signal at a succession of times; and
 c. processing the second data elements to determine a number of second data elements generated per unit time having values greater than a target value that defines a first range and increasing the first gain when the determined number of less than a low threshold value and decreasing the first gain when the determined number is greater than a high threshold value, the low threshold value and the high threshold value defining a second range;

wherein step c comprises:
 c1. generating a counter data of value representing a count of a number of second data elements within a succession of N data elements having values falling within the first range, where N is an integer greater than 1, and
 c2. adjusting the first gain when the value of the counter data falls outside the second range;

wherein step c1 comprises;
 c11. generating a pulse of a first control signal in response to every Nth pulse of a periodic clock signal (CLK):
 c12. generating output data in response to each second data element, the output data being of value indicating whether an absolute value of the second data element resides within the first range; and
 c13. altering the value of the counter data in response to each pulse of the periodic clock signal (CLK) depending on whether the output data is of value indicating that the absolute value of the second data element resides within the first range, and
 c14. setting the value of the counter data to zero on each pulse of the first control signal.

10. The method in accordance with claim 9, further comprising the steps of:
 e. processing the second data elements with a second gain to produce a sequence of third data elements, each having a real number value that is substantially proportional to a product of the integer value of a corresponding one of the first data elements and a second gain;
 f. processing the third data elements to produce a sequence of fourth data elements, wherein each fourth data element has an integer value approximating a value of a corresponding one of the third data elements; and
 g. controlling the second gain in response to a comparison of values of corresponding elements of the third and fourth data elements.

11. A method for processing a differential first pulse amplitude modulated (PAM) signal having a time varying magnitude representing a sequence of integer-valued first data elements, the method comprising:
 a. amplifying the first PAM signal with an adjustable first gain to produce a second PAM signal;
 b. digitizing the second PAM signal to generate a sequence of second data elements having values representing magnitudes of the second PAM signal at a succession of times;
 c. processing the second data elements to determine a number of second data elements generated per unit time falling within a first range and adjusting the first gain when the determined number falls outside a second range;
 e. processing the second data elements with a second gain to produce a sequence of third data elements, each having a real number value that is substantially proportional to a product of the integer value of a corresponding one of the first data elements and a second gain;
 f. processing the third data elements to produce a sequence of fourth data elements, wherein each fourth data element has an integer value approximating a value of a corresponding one of the third data elements;
 g. controlling the second gain in response to a comparison of values of corresponding elements of the third and fourth data elements;

wherein controlling the second gain comprises:
 g1. generating first sign indicating data in response to each fourth data element, wherein a value of the first sign indicating data indicates whether a value of the fourth data element is zero, higher than zero, or lower than zero;
 g2. generating second sign indicating data in response to each third data element and its corresponding fourth data element, wherein a value of the second sign indicating data indicates whether a difference in values between the third data element and its corresponding fourth data element is zero, higher than zero, or lower than zero;
 g3. adjusting a value of count data in response with a combination of values of the first sign indicating data and the second sign indicating data; and
 g4. adjusting the second gain in response to the count data.

12. The method in accordance with claim 11 wherein the second gain is altered when the value of the count data goes outside predetermined limits.

13. The method in accordance with claim 12 wherein step g further comprises the substep of:
 g5. setting the value of the count data to zero when the value count data goes outside the predetermined limits.

14. A method for processing a differential first pulse amplitude modulated (PAM) signal having a time varying magnitude representing a sequence of integer-valued first data elements, the method comprising:

a. amplifying the first PAM signal with an adjustable first gain to produce a second PAM signal;

b. digitizing the second PAM signal to produce a sequence of second data elements representing magnitudes of the second PAM signal at a succession of times;

c. generating counter data of value representing a count of a number of second data elements within a succession of N data elements having values falling within the first range, where N is an integer greater than 1;

d. adjusting the first gain when the value of the counter data falls outside the second range;

e. processing the second data elements to produce a sequence of third date elements, each having a real number value that is substantially proportional to a product of the integer value of a corresponding one of the first data elements and a second gain;

f. processing the third data elements to produce a sequence of fourth data elements, wherein each fourth data element has an integer value approximating a value of a corresponding one of the third data elements;

g. controlling the second gain in response to a comparison of values of corresponding third and fourth data elements;

wherein controlling the second gain comprises:

g1. generating first sign indicating data in response to each fourth data element, wherein a value of the first sign indicating data indicates whether a value of the fourth data element is zero, higher than zero, or lower than zero;

g2. generating second sign indicating data in response to each third data element and its corresponding fourth data element, wherein a value of the second sign indicating data indicates whether a difference in values between the third data element and its corresponding fourth data element is zero, higher than zero, or lower than zero;

g3. adjusting a value of count data in response to a combination of values of the first sign indicating data and the second sign indicating data; and g4. adjusting the second gain in response to the count data.

15. The method in accordance with claim 14 wherein the second gain is adjusted at step g4 when the value of the count data goes outside predetermined limits.

16. The method in accordance with claim 15 wherein step g further comprises the substep of:

g5. setting the value of the count data to zero when the value of the count data goes outside the predetermined limits.

17. An apparatus for processing a differential first pulse amplitude modulated (PAM) signal having a time varying magnitude representing a sequence of integer-valued first data elements, the apparatus comprising:

amplifying means for amplifying the first PAM signal with an adjustable first gain to produce a second PAM signal;

digitizing means for processing the second PAM signal to generate a sequence of second data elements having values representing magnitudes of the second PAM signal at a succession of times; and first automatic gain control (AGC) means for determining a number of second data elements generated per unit of time having values within a first range and for adjusting the first gain when the determined number falls outside a second range; wherein the first AGC means comprises:

first means for generating a counter data of value representing a count of second data elements within a succession of N data elements having values falling within the first range, where N is an integer greater than 1, and second means for adjusting the first gain when the value of the counter data falls outside the second range;

wherein the second means comprises:

a slicer for generating slicer data in response to the counter data of value indicating whether the value of the counter data resides above, below or within the second range; and means for altering the first gain in response to the value of the slicer data.

18. A method for processing a differential first pulse amplitude modulated (PAM) signal having a time varying magnitude representing a sequence of integer-valued first data elements, the method comprising the steps of:

a. amplifying the first PAM signal with an adjustable first gain to produce a second PAM signal;

b. digitizing the second PAM signal to generate a sequence of second data elements having values representing magnitudes of the second PAM signal at a succession of times; and c. processing the second data elements to determine a number of second data elements generated per unit time having values greater than a target value that defines a first range and increasing the first gain when the determined number of less than a low threshold value and decreasing the first gain when the determined number is greater than a high threshold value, the low threshold value and the high threshold value defining a second range;

wherein step c comprises:

c1. generating a counter data of value representing a count of a number of second data elements within a succession of N data elements having values falling within the first range, where N is an integer greater than 1, and c2. adjusting the first gain when the value of the counter data falls outside the second range;

c3. generating slicer data in response to the counter data of value indicating whether the value of the counter data resides above, below or within the second range; and c4. altering the first gain in response to the value of the slicer data.

* * * * *